(12) United States Patent
Hayashi et al.

(10) Patent No.: US 10,964,440 B2
(45) Date of Patent: Mar. 30, 2021

(54) ANISOTROPIC CONDUCTIVE FILM

(71) Applicant: DEXERIALS CORPORATION, Tokyo (JP)

(72) Inventors: Shinichi Hayashi, Utsunomiya (JP); Kenji Tokuhisa, Tokyo (JP); Etsuko Yamaguchi, Oyama (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 16/071,858

(22) PCT Filed: Feb. 10, 2017

(86) PCT No.: PCT/JP2017/004887
§ 371 (c)(1),
(2) Date: Jul. 20, 2018

(87) PCT Pub. No.: WO2017/145801
PCT Pub. Date: Aug. 31, 2017

(65) Prior Publication Data
US 2019/0027267 A1 Jan. 24, 2019

(30) Foreign Application Priority Data

Feb. 22, 2016 (JP) .............................. JP2016-031087
May 13, 2016 (JP) .............................. JP2016-096768

(51) Int. Cl.
*H01B 1/22* (2006.01)
*H01B 5/16* (2006.01)
*C08G 59/24* (2006.01)
*C08G 59/40* (2006.01)
*C08K 3/08* (2006.01)
*C08K 5/19* (2006.01)
*C08L 63/00* (2006.01)
*C08L 71/08* (2006.01)
*C08J 5/18* (2006.01)
*C08G 59/68* (2006.01)
*H01L 23/00* (2006.01)
(Continued)

(52) U.S. Cl.
CPC .............. *H01B 1/22* (2013.01); *C08G 59/24* (2013.01); *C08G 59/245* (2013.01); *C08G 59/4014* (2013.01); *C08G 59/4064* (2013.01); *C08G 59/686* (2013.01); *C08G 59/687* (2013.01); *C08G 65/18* (2013.01); *C08J 5/18* (2013.01); *C08K 3/08* (2013.01); *C08K 5/19* (2013.01); *C08L 63/00* (2013.01); *C08L 71/00* (2013.01); *C08L 71/08* (2013.01); *H01B 5/16* (2013.01); *H01L 24/00* (2013.01); *H01L 24/29* (2013.01); *C08G 2650/56* (2013.01); *C08K 2003/085* (2013.01); *C08K 2003/0831* (2013.01); *C08K 2003/0843* (2013.01); *C08K 2003/0862* (2013.01); *C08K 2201/001* (2013.01); *C08L 2203/16* (2013.01); *H01L 24/32* (2013.01); *H01L 24/83* (2013.01); *H01L 2224/294* (2013.01); *H01L 2224/2929* (2013.01); *H01L 2224/2939* (2013.01); *H01L 2224/29301* (2013.01); *H01L 2224/29339* (2013.01); *H01L 2224/29344* (2013.01); *H01L 2224/29347* (2013.01); *H01L 2224/29355* (2013.01); *H01L 2224/29357* (2013.01); *H01L 2224/29364* (2013.01); *H01L 2224/29391* (2013.01); *H01L 2224/32225* (2013.01); *H01L 2224/8385* (2013.01); *H01L 2224/83203* (2013.01); *H01L 2224/8585* (2013.01); *H01L 2924/14* (2013.01)

(58) Field of Classification Search
None
See application file for complete search history.

(56) References Cited

U.S. PATENT DOCUMENTS

| 2010/0060841 A1* | 3/2010 | Shinn | ..................... H05K 3/323 349/150 |
| 2010/0216912 A1* | 8/2010 | Oka | ....................... C08G 59/24 523/466 |

(Continued)

FOREIGN PATENT DOCUMENTS

| JP | H09-176112 A | 7/1997 |
| JP | 2003-346943 A | 12/2003 |

(Continued)

OTHER PUBLICATIONS

Apr. 18, 2017 International Search Report issued in International Patent Application No. PCT/JP2017/004887.

(Continued)

Primary Examiner — Tanisha Diggs
(74) Attorney, Agent, or Firm — Oliff PLC

(57) ABSTRACT

A cationically polymerizable anisotropic conductive film is provided. The cationically polymerizable anisotropic conductive film includes an alicyclic epoxy compound and achieves storage life property better than known anisotropic conductive films while ensuring curing temperature and connection reliability equivalent to known anisotropic conductive films. The anisotropic conductive film contains a binder composition containing a film forming component and a cationically polymerizable component, a cationic polymerization initiator, and conductive particles. The anisotropic conductive film contains a quaternary ammonium salt-based thermal acid generator as a cationic polymerization initiator and an alicyclic epoxy compound and a low polarity oxetane compound as a cationically polymerizable component.

5 Claims, No Drawings

(51) Int. Cl.
  *C08L 71/00* (2006.01)
  *C08G 65/18* (2006.01)

(56) References Cited

U.S. PATENT DOCUMENTS

| | | | |
|---|---|---|---|
| 2014/0291869 A1* | 10/2014 | Park | H01L 24/27 257/783 |
| 2015/0237725 A1 | 8/2015 | Yamada et al. | |
| 2017/0162531 A1* | 6/2017 | Ko | H01B 1/20 |

FOREIGN PATENT DOCUMENTS

| | | |
|---|---|---|
| JP | 2008-179682 A | 8/2008 |
| JP | 2008-308596 A | 12/2008 |
| JP | 2011-171307 A | 9/2011 |
| JP | 2012-171980 A | 9/2012 |
| JP | 2014-137462 A | 7/2014 |
| KR | 2015-0119935 A | 10/2015 |
| KR | 2017-0067031 A | 6/2017 |
| WO | 2012/018123 A1 | 2/2012 |
| WO | 2014/045931 A1 | 3/2014 |
| WO | 2015/122109 A1 | 8/2015 |

OTHER PUBLICATIONS

Apr. 18, 2017 Written Opinion issued in International Patent Application No. PCT/JP2017/004887.
Jun. 26, 2018 International Preliminary Report on Patentability issued in International Patent Application No. PCT/JP2017/004887.
Jan. 20, 2020 Office Action issued in Korean Patent Application No. 10-2018-7019787.
Mar. 24, 2020 Notification of Reasons for Refusal issued in Japanese Patent Application No. 2016-096768.
Sep. 10, 2020 Office Action issued in Taiwanese Patent Application No. 106104604.
Jul. 21, 2020 Chinese Office Action issued in Chinese Patent Application No. 201780010511.3.
Oct. 23, 2020 Office Action issued in Korean Patent Application No. 10-2018-7019787.

\* cited by examiner

ANISOTROPIC CONDUCTIVE FILM

TECHNICAL FIELD

The present invention relates to an anisotropic conductive film.

BACKGROUND ART

An anisotropic conductive film in which conductive particles are dispersed in an insulating binder composition containing a polymerizable compound has been widely used for mounting an electronic component such as an IC chip on a wiring board in the related art. Patent Documents 1 to 3 propose the use of an alicyclic epoxy compound as a polymerizable compound in such an anisotropic conductive film, the alicyclic epoxy compound having higher cationic polymerization reactivity than that of glycidyl ether compounds that are generally used, in order to achieve rapid curability at a low temperature, and also the use of a sulfonium salt-based thermal acid generator that generates protons by heat as a polymerization initiator that exhibits no polymerization inhibition due to oxygen and exhibits dark reactivity. Such an anisotropic conductive film of the related art containing an alicyclic epoxy compound and a sulfonium salt-based thermal acid generator exhibits a relatively low curing temperature (for example, approximately 100° C.).

CITATION LIST

Patent Literature

Patent Document 1: JP 09-176112 A
Patent Document 2: JP 2008-308596 A
Patent Document 3: WO 2012/018123 A

SUMMARY OF INVENTION

Technical Problem

However, for the anisotropic conductive film described above, time required from the production to actual use is increased due to globalization of commercial trade and the like, or the anisotropic conductive film may be stored in the warehouse that has insufficient air condition. Therefore, there has been a concern about a decrease in storage life property (storage life) from the perspective of temporary bonding, impression formation or the like, and a decrease in connection reliability from the perspective of adhesion property or the like.

An object of the present invention is to provide a cationically polymerizable anisotropic conductive film that contains an alicyclic epoxy compound and that can exhibit storage life property better than known anisotropic conductive films while ensuring curing temperature and connection reliability equivalent to known anisotropic conductive films.

Solution to Problem

The inventor of the present invention discovered that storage life property better than known anisotropic conductive films can be achieved while ensuring curing temperature and connection reliability equivalent to known anisotropic conductive films by using a specific amount of a low polarity oxetane compound in addition to the alicyclic epoxy compound as a cationically polymerizable compound and using a quaternary ammonium salt-based thermal acid generator in place of a sulfonium salt-based thermal acid generator as a cationic polymerization initiator, and completed the present invention.

That is, an object of the present invention is to provide an anisotropic conductive film including: a binder composition containing a film forming component and a cationically polymerizable component; a cation polymerization initiator; and conductive particles, wherein the cationic polymerization initiator is a quaternary ammonium salt-based thermal acid generator, and the cationically polymerizable component contains an alicyclic epoxy compound and a low polarity oxetane compound.

Furthermore, an object of the present invention is to provide a connection structure including the above-mentioned anisotropic conductive film, a first electronic component, and a second electronic component, wherein the first electronic component and the second electronic component are anisotropically conductively connected via the anisotropic conductive film.

Advantageous Effects of Invention

That is, the anisotropic conductive film according to an embodiment of the present invention includes: a binder composition containing a film forming component and a cationically polymerizable component; a cationic polymerization initiator; and conductive particles. The anisotropic conductive film according to an embodiment of the present invention contains a quaternary ammonium salt-based thermal acid generator as the cationic polymerization initiator and contains an alicyclic epoxy compound and a low polarity oxetane compound as the cationically polymerizable component. Therefore, the anisotropic conductive film according to an embodiment of the present invention can achieve storage life property better than known anisotropic conductive films while ensuring curing temperature and connection reliability equivalent to known anisotropic conductive films.

DESCRIPTION OF EMBODIMENTS

Examples of the present invention will be described hereinafter.
Anisotropic Conductive Film
The anisotropic conductive film according to an embodiment of the present invention contains a binder composition containing a film forming component and a cationically polymerizable component, a cationic polymerization initiator and conductive particles.
Binder Composition
In an embodiment of the present invention, the binder composition, which contains and retains conductive particles, contains a film forming component and a cationically polymerizable component.
Film Forming Component
The film forming component is a component used for forming an anisotropic conductive film and having film forming ability. Examples of the film forming component include, phenoxy resins, epoxy resins, unsaturated polyester resins, saturated polyester resins, urethane resins, butadiene resins, polyimide resins, polyamide resins, and polyolefin resins. Two or more of these may be used in combination. Among these, phenoxy resins may be preferably used from the perspective of film forming ability, processability, and connection reliability.

The compounded proportion of the film forming component in the binder composition is preferably from 10 to 70 mass %, and more preferably from 20 to 50 mass %. The proportion in this range allows the film forming component to exhibit sufficient film forming ability.

Cationically Polymerizable Component

The cationically polymerizable component is a component for curing the anisotropic conductive film and contains an alicyclic epoxy compound and a low polarity oxetane compound. The compounded proportion of the cationically polymerizable component in the binder composition is preferably from 10 to 80 mass %, and more preferably from 20 to 60 mass %. The proportion in this range allows the binder composition to exhibit higher curing rate.

Alicyclic Epoxy Compound

The alicyclic epoxy compound having higher reactivity than that of generally used glycidyl ether epoxy resin compounds is used for imparting favorable rapid curability at a low temperature to the anisotropic conductive film. Preferred examples of such an alicyclic epoxy compound include alicyclic epoxy compounds containing two or more epoxy groups per molecule. These alicyclic epoxy compounds may be a liquid or a solid. Specific examples thereof include diglycidyl hexahydrobisphenol A, 3,4-epoxycyclohexenylmethyl-3',4'-epoxycyclohexenecarboxylate, and diepoxybicyclohexyl. Among them, diglycidyl hexahydrobisphenol A, particularly, diepoxybicyclohexyl is preferably used from the perspective of securing optical transparency of the cured product and achieving excellent rapid curability.

Low Polarity Oxetane Compound

In an embodiment of the present invention, a low polarity oxetane compound is used together with the alicyclic epoxy compound. The low polarity oxetane compound, which is an oxetane compound having a dipole moment of 3.0 d or less and having a relatively low surface tension, can impart a favorable leveling property to the membrane of the anisotropic conductive film. This enhances storage life property of the anisotropic conductive film. On the other hand, the low polarity oxetane compound has a function of increasing the reaction start temperature and reaction end temperature of the anisotropic conductive film derived from the alicyclic epoxy compound as measured by a differential scanning calorimetry (DSC). Examples of the low polarity oxetane compound include 3-ethyl-3-(2-ethylhexyloxymethyl)oxetane, 3-ethyl-3-hydroxymethyloxetane, di[1-ethyl(3-oxetanyl)]methylether, 4,4'-bis[(3-ethyl-3-oxetanyl)methoxymethyl]biphenyl. Among them, 3-ethyl-3-(2-ethylhexyloxymethyl)oxetane, particularly, 4,4'-bis[(3-ethyl-3-oxetanyl)methoxymethyl]biphenyl is preferred from the perspective of achieving low surface tension and excellent wettability.

The compounded proportion of alicyclic epoxy compound and low polarity oxetane compound is preferably from 25:75 to 60:40, more preferably from 45:55 to 60:40, particularly preferably from 50:50 to 55:45 on a mass basis. In a case where the compounded amount of the low polarity oxetane compound is greater than this range, the reaction start temperature and reaction end temperature tend to increase, whereas in a case where the compounded amount is smaller, storage life property tends to decreases. Accordingly, adjustment of the compounded proportion of alicyclic epoxy compound and low polarity oxetane compound enables control of the reaction start temperature and reaction end temperature of the anisotropic conductive film. Further, adjustment of temperature elevation rate during the reaction or the like enables control of reaction time.

The binder composition may contain, as necessary, other epoxy resins such as a bisphenol A epoxy resin, a bisphenol F epoxy resin, a novolac epoxy resin, and a modified epoxy resin thereof, a silane coupling agent, a filler, a softener, an accelerator, an anti-aging agent, a coloring agent (dye, pigment), an organic solvent, an ion scavenger, or the like. The binder composition may contain a (meth)acrylate compound and a radical polymerization initiator as necessary. Herein, a known (meth)acrylate monomer may be used as the (meth)acrylate compound. Examples thereof include monofunctional (meth)acrylate-based monomers and polyfunctional, that is, (meth)acrylate-based monomers having two or more functionalities. Herein, the (meth)acrylate encompasses acrylate and methacrylate. The binder composition may contain a known radical polymerization initiator such as organic peroxide and azobisbutyronitrile as a radical polymerization initiator.

Conductive Particles

In the anisotropic conductive film according to an embodiment of the present invention, the binder composition contains conductive particle in order to achieve anisotropically conductive connection. As conductive particles, any of known conductive particle used for anisotropic conductive films may be appropriately selected and used. Examples thereof include particles of metals such as nickel, cobalt, silver, copper, gold, or palladium, particles of alloys such as solder, and metal-coated resin particles. A combination of two or more materials may also be used.

The average particle diameter of the conductive particles is preferably from 2.5 µm to 30 µm, and more preferably from 3 µm to 9 µm. Such an average particle diameter can accommodate variations in the height of the wiring, inhibit an increase in conduction resistance, and inhibit the occurrence of a short circuit. The particle diameter of the conductive particles can be measured using a common particle diameter distribution analyzer, and the average particle diameter can also be determined using the particle diameter distribution analyzer.

In a case where the conductive particles are metal-coated resin particles, the particle hardness of the resin core particles (20% K value: compressive elastic deformation characteristics $K_{20}$) is preferably from 100 to 1000 kgf/mm$^2$, and more preferably from 200 to 500 kgf/mm$^2$ to achieve favorable connection reliability. The compressive elastic deformation characteristics $K_{20}$ can be measured, for example, using a micro compression tester (MCT-W201, Shimadzu Corporation) at a measurement temperature of 20° C.

The conductive particles are present in the anisotropic conductive film, preferably from 50 to 100000 per square millimeter, and more preferably from 200 to 70000 per square millimeter, from the perspective of inhibiting a decrease in the efficiency of conductive particle capturing and inhibiting the occurrence of a short circuit. The amount of the conductive particles present can be measured by observing the film surface using an optical microscope. Note that, in the anisotropic conductive film, the conductive particles contained in the binder composition may not be easily observable by the optical microscope before the anisotropically conductive connection. In such a case, the anisotropic conductive film may be observed after anisotropically conductive connection. In this case, the amount of the conductive particles present may be determined considering the change in the film thickness before and after connection.

The amount of the conductive particles present in the anisotropic conductive film can also be expressed on a mass basis. Specifically, the amount of the conductive particles present preferably ranges from 1 part by mass to 30 parts by mass, and more preferably from 3 parts by mass to 10 parts by mass, per 100 parts by mass with the total mass of the anisotropic conductive film being taken as 100 parts by mass.

Cationic Polymerization Initiator

The anisotropic conductive film according to an embodiment of the present invention contains a quaternary ammonium salt-based thermal acid generator rather than a sulfonium salt-based thermal acid generator as a cationic polymerization initiator. This is for enhancing storage life property. Examples of the quaternary ammonium salt-based thermal acid generator include salts of quaternary ammonium cation and hexafluoroantimonate anion, hexafluorophosphate anion, trifluoromethanesulfonate anion, perfluorobutanesulfonate anion, dinonylnaphthalenesulfonate anion, p-toluenesulfonate anion, dodecylbenzenesulfonate anion, or tetrakis(pentafluorophenyl)borate anion. Examples of the quaternary ammonium cation include cations represented by $[NR_1R_2R_3R_4]^+$. Herein, $R_1$, $R_2$, $R_3$, and $R_4$ are a straight-chain, branched-chain or cyclic alkyl group or aryl group having from 1 to 12 carbons and each may have a hydroxyl group, a halogen, an alkoxyl group, an amino group, an ester group, or the like.

Examples of the quaternary ammonium salt-based thermal acid generator include CXC-1612, CXC-1733, CXC-1738, TAG-2678, CXC-1614, TAG-2689, TAG-2690, TAG-2700, CXC-1802-60, and CXC-1821 manufactured by King Industries, Inc. These product are available from Kusumoto Chemicals, Ltd.

The thickness of the anisotropic conductive film according to an embodiment of the present invention is preferably from 3 to 50 µm, and more preferably from 5 to 20 µm.

Manufacture of Anisotropic Conductive Film

In the anisotropic conductive film according to an embodiment of the present invention, a coating material is prepared by dissolving the binder composition, conductive particles, and a cationic polymerization initiator in an organic solvent such as toluene. The anisotropic conductive film can be produced by forming a film using the coating material by a known film forming method.

Although the anisotropic conductive film according to an embodiment of the present invention may be a single layer, an insulating resin layer may be laminated for the purpose of reducing the amount of the conductive particles used to reduce production cost while inhibiting a decrease in capture of the conductive particles, and eliminating an operation of under filling. In this case, the anisotropic conductive film according to an embodiment of the present invention has a two-layered structure including a conductive particle-containing layer and an insulating resin layer. Such an insulating resin layer may be basically formed from a composition obtained by blending a cationic polymerization initiator in the binder composition used in the anisotropic conductive film without blending conductive particles.

In the anisotropic conductive film according to an embodiment of the present invention, the reaction start temperature is preferably adjusted to 60 to 80° C., and the reaction end temperature is preferably adjusted to 155 to 185° C. for the reaction peak measured by a differential scanning calorimeter from the perspective of controlling reaction velocity. These adjustments may be performed by adjusting, for example, the compounded proportion of alicyclic epoxy compound and low polarity oxetane compound.

Connection Structure

The anisotropic conductive film according to an embodiment of the present invention can be advantageously used when anisotropically conductively connecting a first electronic component, such as an IC chip, an IC module, or an FPC, to a second electronic component, such as a plastic substrate, a glass substrate, a rigid substrate, or a ceramic substrate, and an FPC. In the anisotropic conductive film according to an embodiment of the present invention, a connection structure, in which the first electronic component and the second electronic component are anisotropically conductively connected, is included in the present invention. Known techniques may be employed for the method of connecting electronic components using the anisotropic conductive film.

EXAMPLES

The present invention will be described in more detail below with reference to examples.

Example 1

Formation of Conductive Particle-containing Layer

To toluene, 60 parts by mass of a phenoxy resin (YP-50, Nippon Steel & Sumikin Chemical Co., Ltd.), 10 parts by mass of diepoxybicyclohexyl (CELLOXIDE 8000, Daicel Corporation) as an alicyclic epoxy compound, 20 parts by mass of a low polarity oxetane compound (OXBP, Ube Industries, Ltd.), 2 parts by mass of a thermal cationic polymerization initiator (quaternary ammonium salt-based thermal acid generator, trade name, CXC-1612, Kusumoto Chemicals, Ltd.), and 50 parts by mass of conductive particles having an average particle diameter of 3 µm (Ni/Au plated resin particles, AUL704, Sekisui Chemical Co., Ltd.) were added and a liquid mixture having a solid content of 50 mass % was prepared.

The obtained liquid mixture was applied on a polyethylene terephthalate release film (PET release film) having a thickness of 50 µm to a dried thickness of 6 µm. The film was dried for 5 minutes in an oven at 60° C. to form a conductive particle-containing layer.

Formation of Insulating Resin Layer

The same raw materials as the materials used in the formation of the conductive particle-containing layer, except the conductive particles, were added to toluene and a liquid mixture having a solid content of 50 mass % was prepared.

The obtained liquid mixture was applied on a PET release film having a thickness of 50 µm to a dried thickness of 12 µm. The film was dried for 5 minutes in an oven at 60° C. to form an insulating resin layer.

Production of Anisotropic Conductive Film

An anisotropic conductive film being held between a pair of PET release films having a thickness of 50 µm was obtained by laminating the insulating resin layer on the conductive particle-containing layer at 60° C. at 5 MPa.

Examples 2 to 4

An anisotropic conductive film was obtained in the same manner as in Example 1 except that the compounded amounts (proportions) of the alicyclic epoxy compound (CELLOXIDE 8000, Daicel Corporation) and the low polarity oxetane compound (4,4'-bis[(3-ethyl-3-oxetanyl)methoxymethyl]biphenyl (OXBP, Ube Industries, Ltd.) in the conductive particle-containing layer and the insulating resin layer were changed to the compounded amounts listed in Table 1.

Comparative Examples 1 to 4

An anisotropic conductive film was produced in the same manner as in Examples 1 to 4 except that a thermal cationic polymerization initiator in the conductive particle-containing layer and the insulating resin layer was replaced with a sulfonium salt-based thermal acid generator (SI-60L, Sanshin Chemical Industry Co., Ltd) as listed in Table 1.

Examples 5 to 13 and Comparative Example 5

An anisotropic conductive film was prepared in the same manner as in Example 1 except that the compounded amounts (proportions) of the alicyclic epoxy compound (CELLOXIDE 8000, Daicel Corporation) and the low polarity oxetane compound (OXBP, Ube Industries, Ltd.) in the conductive particle-containing layer and insulating resin layer were changed to the compounded amounts listed in Table 1.

Evaluation

The anisotropic conductive films obtained in the Examples and the Comparative Examples were evaluated by testing or measuring storage life property, curing temperature, adhesion property, and reaction time.

Storage Life Property

The anisotropic conductive film being held between the pair of PET release films was placed in a constant-temperature and constant-humidity chamber set at a humidity of 40%, at a temperature of 25° C. or 30° C. and sampling was then performed every 24 hours after the placement of the film. The following temporarily bond evaluation and compression-bond evaluation were performed and storage life property was comprehensively evaluated based on the evaluation results. The obtained results are shown in Table 1.

Temporarily Bond Evaluation

The PET release film on the side of the conductive particle-containing layer of the anisotropic conductive film was peeled off. The anisotropic conductive film was then adhered to a piece of blank glass from the side of conductive particle-containing layer, thereby producing a laminate of blank glass and the anisotropic conductive film. The laminate was placed on a hot plate that was set to 45° C., the blank glass side of the laminate being in contact with the hot plate. The laminate was pressed by hand from the anisotropic conductive film side of the laminate, and then cooled down to room temperature. After cooling, the PET release film on the insulating resin layer side of the laminate was peeled off from the laminate, and it was confirmed whether only a PET release film was peeled off without the anisotropic conductive film peeling off from the blank glass.

Compression-Bond Evaluation

The anisotropic conductive film was sandwiched between the test IC chip and test substrate with the insulating resin layer being disposed on the IC chip side. Heat and pressure were applied to this assembly (120° C., 60 MPa, 5 seconds) to produce a connected object for evaluation. The state of impression formation of the prepared connected object was observed and it was confirmed whether the impression remained without becoming slight or disappearing.

Storage Life Property Evaluation

In the temporarily bond evaluation, the time at which the anisotropic conductive film was peeled off from the blank glass was defined as storage life. Note that, even in the case where the anisotropic conductive film was not peeled off from the blank glass in the temporarily bond evaluation, the time at which the impression became slight (disappeared) in the compression-bond evaluation was defined as storage life.

Curing Temperature

The anisotropic conductive film was sandwiched between the test IC chip and test substrate with the insulating resin layer being disposed on the IC chip side. Heat and pressure were applied to this assembly (80° C., 90° C., 100° C., 110° C., or 120° C., 60 MPa, 5 seconds) to obtain a connected object for evaluation. The reaction rate of the anisotropic conductive film in the connected object was measured as described below and the curing temperature was determined from the measurement results. The obtained results are shown in Table 1.

Reaction Rate Measurement

The IC chip of the connected object for evaluation was picked up and peeled off by hand to expose the cured anisotropic conductive film, and the anisotropic conductive film was sampled. The obtained sample was dissolved in acetonitrile such that the concentration is 0.1 g/mL. An anisotropic conductive film before curing was separately dissolved in acetonitrile such that the concentration was the same as the above concentration and the peak intensity for each monomer was examined using HPLC-MS (WATERS) under the following conditions. The reaction rate at each temperature was determined from a decrease in the peak intensity after curing and the temperature at which the reaction rate was not less than 80% was defined as curing temperature.

Solvent: mixed solvent obtained by mixing 40 parts by mass of acetonitrile in 60 parts by mass of water/acetonitrile mixed solution (90/10)

Flow rate: 0.4 mL/min

Column: 10 cm, 40° C.

Injection amount: 5 μL

Analysis wavelength: 210 to 410 nm

Adhesion Property

The anisotropic conductive film was sandwiched between the test IC chip and test substrate with the insulating resin layer being disposed on the IC chip side. Heat and pressure were applied to this assembly (120° C., 60 MPa, 5 seconds) to produce a connected object for evaluation. Pressure cooker test (PCT) was performed on the connected object using EHS-411M, from Etac Engineering Corp. Specifically, the obtained connected object for evaluation was placed in a thermo-hygrostat set at 121° C., 2 atm, under the saturated steam atmosphere and the following adhesion evaluation was performed every 24 hours. The obtained results are shown in Table 1.

Adhesion Evaluation

The appearance of the connected object subjected to PCT test was observed and the occurrence of interlayer delamination between the anisotropic conductive film and the IC chip or the substrate was visually observed.

Ranking Criteria

Good: no peeling was observed after IC compression-bonding in 48-hour PCT test

Marginal: no peeling was observed after IC compression-bonding in 24-hour PCT test, but peeling was observed in 48-hour PCT test Poor: peeling was observed after IC compression-bonding before PCT, or peeling was observed in 24-hour PCT test Reaction Time Approximately 5 mg of sample cut out from the obtained anisotropic conductive film was placed in an aluminum pan (TA Instruments Inc.) and the aluminum pan was set in a differential scanning calorimeter (DSC) measurement device (Q2000, TA Instruments Inc.). Measurement was performed by DSC in the temperature range of 30° C. to 250° C. at a temperature elevation rate of 10° C./min. From the obtained DSC chart, an onset temperature at which the exothermic peak appeared was read as the reaction start temperature and an offset temperature at which the exothermic peak disappeared back to the base line was read as the reaction end temperature. Reaction time was calculated based on the following equation. The obtained results are shown in Table 1.

Reaction time (minute)=Reaction end temperature (° C.)−reaction start temperature (° C.)/10 (° C./min)

be significantly prolonged without a change in the adhesion property, which is an evaluation indicator of curing temperature and connection reliability, regardless of variation in the compounding ratio of alicyclic epoxy compound and low polarity oxetane compound.

TABLE 1

| | Cationically polymerizable component (part by mass) | | | | Reaction start temperature (° C.) | Reaction end temperature (° C.) | Reaction time (minute) | Storage life property (days) | Curing temperature (° C.) | Adhesion property |
|---|---|---|---|---|---|---|---|---|---|---|
| | A: Alicyclic epoxy compound | B: Low polarity oxetane compound | A/B | Thermal cationic polymerization initiator | | | | | | |
| Example 1 | 10 | 20 | 1/2 | Quaternary ammonium salt-based thermal acid generator | 70 | 178 | 10.8 | 10 | 100 | Good |
| Comparative Example 1 | 10 | 20 | 1/2 | Sulfonium salt-based thermal acid generator | — | — | — | 3 | 100 | Good |
| Example 2 | 5 | 20 | 0.5/2 | Quaternary ammonium salt-based thermal acid generator | — | — | — | 15 | 100 | Marginal |
| Comparative Example 2 | 5 | 20 | 0.5/2 | Sulfonium salt-based thermal acid generator | — | — | — | 3 | 100 | Marginal |
| Example 3 | 10 | 15 | 1/1.5 | Quaternary ammonium salt-based thermal acid generator | — | — | — | 10 | 100 | Good |
| Comparative Example 3 | 10 | 15 | 1/1.5 | Sulfonium salt-based thermal acid generator | — | — | — | 3 | 100 | Good |
| Example 4 | 10 | 10 | 1/1 | Quaternary ammonium salt-based thermal acid generator | — | — | — | 7 | 90 | Good |
| Comparative Example 4 | 10 | 10 | 1/1 | Sulfonium salt-based thermal acid generator | — | — | — | 1 | 90 | Good |
| (Example 1) | (10) | (20) | (1/2) | (Quaternary ammonium salt-based thermal acid generator) | (70) | (178) | (10.8) | (10) | (100) | (Good) |
| Example 5 | 7 | 20 | 0.7/2 | Quaternary ammonium salt-based thermal acid generator | 72 | 180 | 10.8 | 10 | 100 | Good |
| Example 6 | 5 | 20 | 0.5/2 | Quaternary ammonium salt-based thermal acid generator | 82 | 190 | 10.8 | 15 | 100 | Marginal |
| Example 7 | 2.5 | 20 | 0.25/2 | Quaternary ammonium salt-based thermal acid generator | 90 | 200 | 11 | 15 | 100 | Marginal |
| Comparative Example 5 | 0 | 20 | 0/2 | Quaternary ammonium salt-based thermal acid generator | 100 | 230 | 13 | 20 | 120 | Poor |
| Example 8 | 10 | 17.5 | 1/1.75 | Quaternary ammonium salt-based thermal acid generator | 70 | 175 | 10.5 | 10 | 100 | Good |
| Example 9 | 10 | 15 | 1/1.5 | Quaternary ammonium salt-based thermal acid generator | 68 | 175 | 10.7 | 10 | 100 | Good |
| Example 10 | 10 | 12.5 | 1/1.25 | Quaternary ammonium salt-based thermal acid generator | 68 | 175 | 10.7 | 10 | 100 | Good |
| Example 11 | 10 | 10 | 1/1 | Quaternary ammonium salt-based thermal acid generator | 65 | 160 | 9.5 | 7 | 90 | Good |
| Example 12 | 10 | 7.5 | 1/0.75 | Quaternary ammonium salt-based thermal acid generator | 65 | 158 | 9.3 | 5 | 90 | Good |
| Example 13 | 10 | 5 | 1/0.5 | Quaternary ammonium salt-based thermal acid generator | 65 | 150 | 8.5 | 3 | 90 | Marginal |

Discussion of Evaluation Results

From the results in Table 1 (comparison between Example 1 and Comparative Example 1, comparison between Example 2 and Comparative Example 2, comparison between Example 3 and Comparative Example 3, and comparison between Example 4 and Comparative Example 4), it is found that, in a case where the quaternary ammonium salt-based thermal acid generator was used in place of the sulfonium salt-based thermal acid generator, storage life can The comparison between Examples 1, 5 to 7 and Comparative Example 5 shows that as the compounded proportion of low polarity oxetane compound to alicyclic epoxy compound increases, storage life tends to be prolonged. As the compounded proportion of alicyclic epoxy compound decrease accordingly, the adhesion property tends to decrease. The comparison among Examples 8 to 13 shows that as the compounded proportion of low polarity oxetane compound to alicyclic epoxy compound decreases, the storage life tends to be shortened.

Note that, the comparison among the results of DSC measurement in Example 1, Examples 5 to 13, and Comparative Example 5 shows that as the compounded amount of the low polarity oxetane compound increases, the reaction start temperature and the reaction end temperature tend to increase.

INDUSTRIAL APPLICABILITY

The cationically polymerizable anisotropic conductive film containing an alicyclic epoxy compound according to an embodiment of the present invention can achieve storage life property better than known anisotropic conductive films while ensuring curing temperature and connection reliability equivalent to known anisotropic conductive films containing a sulfonium salt-based thermal acid generator. Thus, the anisotropic conductive film according to an embodiment of the present invention is useful for anisotropically conductive connection of electronic components such as an IC chip to a wiring board.

The invention claimed is:

1. An anisotropic conductive film comprising:
   a binder composition containing a film forming component and a cationically polymerizable component;
   a cationic polymerization initiator; and
   conductive particles, wherein
   the cationic polymerization initiator is a quaternary ammonium salt-based thermal acid generator, wherein the quaternary ammonium salt-based thermal acid generator is a salt of quaternary ammonium cation and hexafluoroantimonate anion,
   the cationically polymerizable component contains an alicyclic epoxy compound and a low polarity oxetane compound, wherein the alicyclic epoxy compound is diglycidyl hexahydrobisphenol A or diepoxybicyclohexyl and the low polarity oxetane compound is 3-ethyl-3-(2-ethylhexyloxymethyl)oxetane or 4,4'-bis[(3-ethyl-3-oxetanyl)methoxymethyl]biphenyl, and
   the conductive particles are present in the anisotropic film in a range of from 50 to 100000 per square millimeter, millimeter
   a reaction start temperature of a reaction peak is from 60 to 80° C., and
   a reaction end temperature measured of the reaction peak is from 155 to 185° C., the reaction peak being measured by a differential scanning calorimetry.

2. The anisotropic conductive film according to claim 1, wherein a compounded proportion of the alicyclic epoxy compound and the low polarity oxetane compound is from 25:75 to 60:40 on a mass basis.

3. The anisotropic conductive film according to claim 1, wherein a compounded proportion of the alicyclic epoxy compound and the low polarity oxetane compound is from 45:55 to 60:40 on a mass basis.

4. The anisotropic conductive film according to claim 1, wherein the quaternary ammonium cation is a cation represented by $[NR_1R_2R_3R_4]^+$, where $R_1$, $R_2$, $R_3$, and $R_4$ are a straight-chain, branched-chain or cyclic alkyl group or aryl group having from 1 to 12 carbons.

5. A connection structure comprising:
   the anisotropic conductive film described in claim 1;
   a first electronic component; and
   a second electronic component, wherein
   the first electronic component and the second electronic component are anisotropically conductively connected via the anisotropic conductive film.

* * * * *